United States Patent [19]
Higashi et al.

[11] Patent Number: 5,427,100
[45] Date of Patent: Jun. 27, 1995

[54] METHOD FOR DETERMINING MEDIAN LINE

[75] Inventors: Noboru Higashi; Koichi Sano, both of Yokohama; Tetsuo Yokoyama, Tokyo, all of Japan

[73] Assignee: Hitachi, Ltd., Tokyo, Japan

[21] Appl. No.: 12,919

[22] Filed: Feb. 3, 1993

[30] Foreign Application Priority Data

Feb. 7, 1992 [JP] Japan .................................. 4-022338

[51] Int. Cl.⁶ .............................................. A61B 5/055
[52] U.S. Cl. .................................. 128/653.2; 382/131
[58] Field of Search .......................... 128/653.1, 653.2; 324/309; 378/4, 901; 364/413.13, 413.14; 382/6

[56] References Cited

U.S. PATENT DOCUMENTS

| | | | |
|---|---|---|---|
| 4,856,528 | 8/1989 | Yang et al. | 128/653.1 |
| 4,922,915 | 5/1990 | Arnold et al. | 128/653.1 |
| 4,936,311 | 6/1990 | Oe | 128/653.1 |
| 4,940,057 | 7/1990 | Kamei | 324/322 |
| 5,107,838 | 4/1992 | Yamaguchi | 128/653.2 |
| 5,155,435 | 10/1992 | Kaufman et al. | 324/309 |
| 5,222,500 | 6/1993 | Sugimoto | 128/653.2 |

*Primary Examiner*—Krista M. Pfaffle
*Attorney, Agent, or Firm*—Antonelli, Terry, Stout & Kraus

[57] ABSTRACT

Disclosed is a method for automatically determining the median line of a selected region of a human body so as to simplify complex imaging required hithero for a magnetic resonance imaging apparatus, and, in the method, an artifact of the imaged selected region of the human body is utilized to automatically determine the median line. For example, two artifacts 1010 and 1020 intersecting each other appear from the superior sagittal sinus as shown in FIG. 1 when the direction of phase encoding is changed. By subtracting one of these artifacts 1010 and 1020 from the other and calculating the absolute value of the result of subtraction, the point 1030 of intersection of the artifacts determines the location of the superior sagittal sinus which is the source of apperance of the artifacts, so that the median line can be automatically determined on the basis of the result of determination of location of the superior sagittal sinus.

7 Claims, 9 Drawing Sheets

METHOD FOR DETERMINING MEDIAN LINE

BACKGROUND OF THE INVENTION

This invention relates to a magnetic resonance imaging (abbreviated hereinafter as an MRI) apparatus utilizing the phenomenon of magnetic resonance, and more particularly to a method in which a human body is imaged by the MRI apparatus to determine a selected region of the human body on the image so as to determine the median line of the selected region of the human body.

In an MRI apparatus, a magnetic field is applied to a human body to induce the phenomenon of magnetic resonance of protons in a selected region of the human body, and the resultant magnetic resonance signal is detected and measured to display a tomographic image of the selected region of the human body. When the mode of application of the magnetic field (referred to hereinafter as a sequence) is changed in this MRI apparatus, the corresponding resonance signal can be obtained, so that, for example, the blood vessel only can be selectively imaged.

When a desired tomographic image of a selected region of a human body is to be obtained by this MRI apparatus, a plurality of tomographic images are first taken, and, after determining the desired slice direction on the basis of the anatomical information derived from these tomographic images, the most suitable sequence is selected so as to take the desired tomographic image. Thus, it is required to take a plurality of tomographic images for the purpose of positioning and also to determine the slice direction in order to obtain the desired tomographic image.

In our earlier invention described in patent application Ser. No. 07/870295 filed in the United States on Apr. 17, 1992, a method for automatically determining a sequence used in a usual diagnosis (a routine diagnosis) and a slice direction is registered beforehand, so that the desired tomographic image can be obtained by a single manipulation. In regard to the positioning, the patent application describes that characteristic regions of a human body are detected for the purpose of positioning and describes also a method for positioning, for example, the OM line of the head or the sagittal section of a transverse image of the neck.

Besides the method described above, a method in which the median line of a human body commonly used as an index in, for example, image measurement by the Hough transform is reported in IEEE TRANSACTIONS ON MEDICAL IMAGING, VOL. 10, NO. 1, MARCH 1991.

The above report refers to a method for detecting the median line in a transverse image and a coronal image of the head of a human body. According to the reported method, the head image is subjected to filtering (the Sobel operation) so as to be converted into an edge emphasized head image, and its binary image is subjected to the Hough transform so as to provide the desired median line.

When a different sequence is used in the MRI apparatus imaging a human body, a correspondingly different resonance signal is generated from the human body. This feature is widely utilized in the research and development of various sequences. That is, not only detection of a proton density image but also implementation of an angio sequence for selective measurement of a blood vessel and an ultra-high speed sequence for imaging with a very short imaging period of time are widely attempted.

Under such a background, MRI apparatuses have been improved from year to year to be able to operate with a higher performance, and the applicable range has also been progressively widened. However, with the improvement in the performance of the MRI apparatuses, they have inevitably the problem of requiring a complicated manipulation.

When a tomographic image of a desired region of a human body is required by a doctor for the purpose of diagnosis, a plurality of tomographic images are first taken, and, on the basis of the anatomical information derived from those tomographic images, the doctor determines the desired slice direction so as to obtain the desired tomographic image. Among the information used by the doctor during the process of imaging, the median line [which is the intersection line between the surface of the desired region of the human body and a perpendicular plane (a superior sagittal section) including a sagittal direction of a horizontal line penetrating the human body, that is, a plane (a median section) dividing the human body into its right and left halves] is very important information for accurately obtaining the tomographic image of the desired region of the human body.

The Hough transform described in the above paper as a method of determining the median line uses the sine and cosine functions for the determination. Therefore, the disclosed method used for the determination of the median line has the problem that an increase in the number of factors to be processed results in a corresponding increase in the period of time required for the processing.

SUMMARY OF THE INVENTION

With a view to solve the prior art problems described above, it is an object of the present invention to provide a method of determining the median line by a simple procedure.

Imaging by an MRI apparatus is broadly classified into two cases. In one case, a desired region of an object to be inspected, for example, a human body to be diagnosed is supposed to be stationary, and, in the other case, the desired region of the objected to be inspected, for example, the human body to be diagnosed is supposed to be moving.

In the case of imaging the desired region of the human body which is supposed to be stationary, the image will not be appreciably adversely affected by the flow of blood flowing through a small-diameter blood vessel, such as, a capillary vessel. However, when the desired region includes a large-diameter blood vessel, an artifact tends to appear on the image.

This artifact is affected by the factors including the blood flow velocity, the slice thickness and the imaging period of time and appears in the phase encoding direction. In the present invention, the artifact generated from such a moving region of the human body is utilized so as to determine the median line according to the following three steps (1), (2) and (3):

(1) Utilizing the tendency of appearance of the artifact in the phase encoding direction, two images are taken according to two sequences having respectively different directions of phase encoding, and the point of intersection between these artifacts is determined as the location of the large-diameter blood vessel.

(2) Without the T2 weighting, the interhemispheric fissure is blackend on the image, and the image density of that portion of the image becomes lower than that of the remaining portion of the brain. (A T1 weighted image, a proton density image, etc. are also blackened.) Utilizing this tendency, the location of the interhemispheric fissure is determined by tracing on the basis of the image density.

(3) Utilizing the fact that the median line exists near the center of gravity of the head of the human body, the median line is determined.

The method of the present invention will now be more concretely described.

Figure 1A:
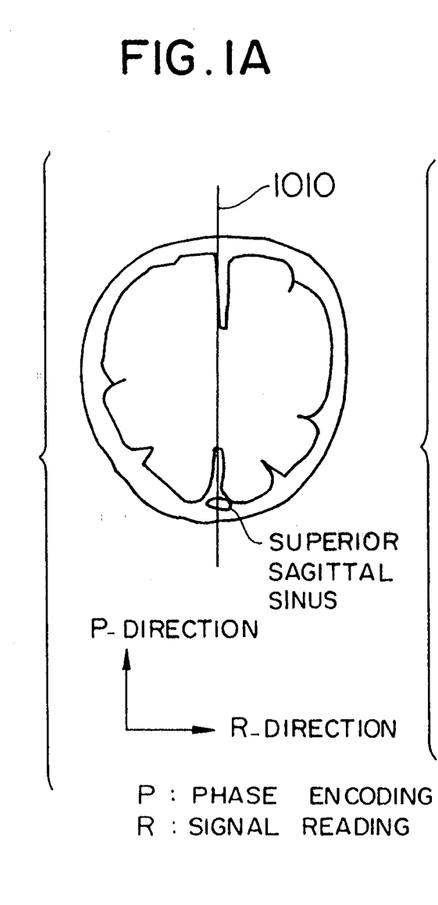
FIGS. 1A–1C illustrate how the location of the superior sagittal sinus in a desired region of a human body is determined on the basis of two intersecting artifacts appearing on a transverse image of the head of the human body.
Figure 1B:
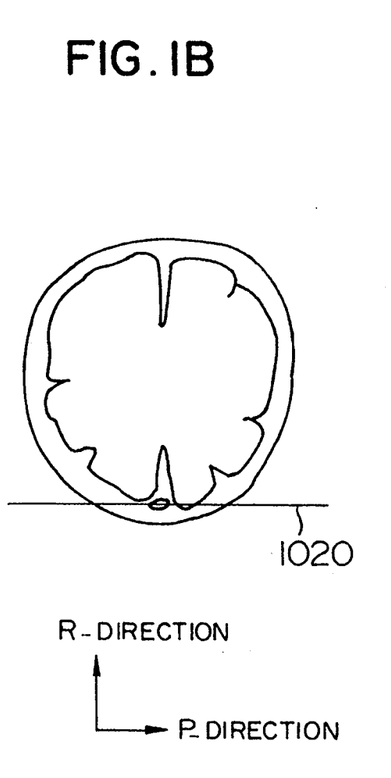
Figure 1C:
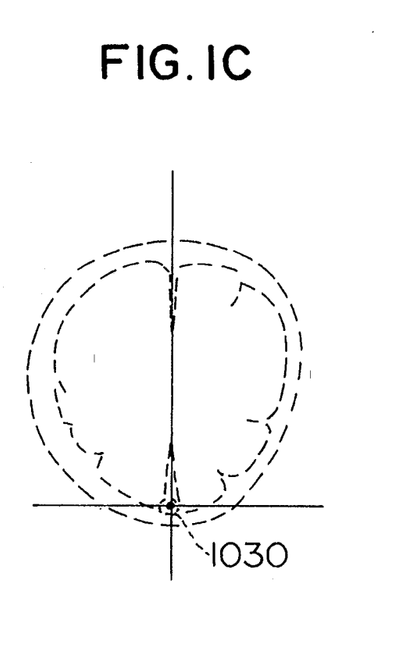

(1) When a transverse image of the head is taken according to a sequence which does not restrict the blood flow, a linear artifact extending in the phase encoding direction from the superior sagittal sinus having an especially large diameter in the brain appears, as shown in FIGS. 1A–1C. This superior sagittal sinus lies behind the median line and is located at a position near the outer skin layer of the skull. Therefore, by determining the location of this superior sagittal sinus, the information regarding the position of one end of the median line can be acquired.

Figure 8:
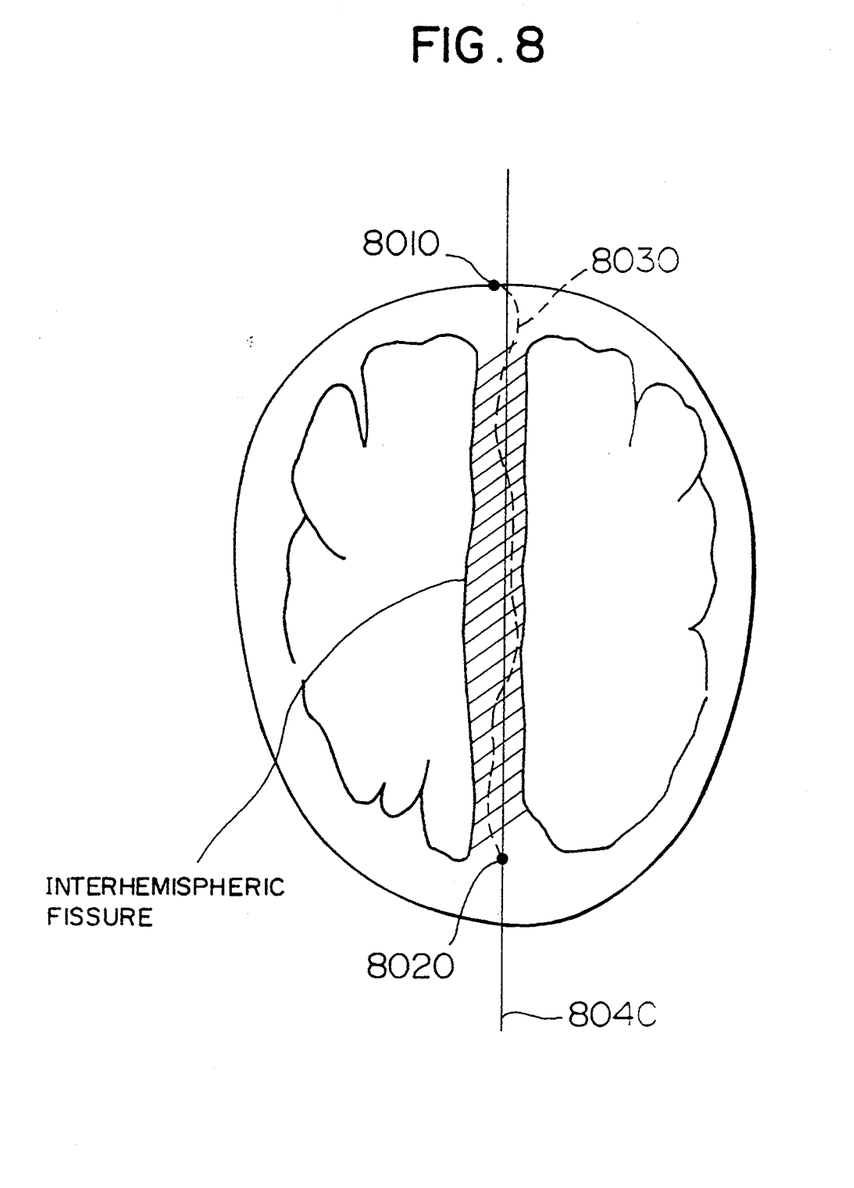
FIG. 8 illustrates how the median line is determined as a result of tracing the interhemispheric fissure on the transverse image of the head.

(2) In the brain, the interhemispheric fissure is the region corresponding to the median line (plane), as shown in FIG. 8. As described already, without the T2 weighting, the resonance signal from the interhemispheric fissure is not emphasized, resulting in blackening of that portion on the image. Also, the superior sagittal sinus is located near the terminating end of the interhemispheric fissure. Utilizing the above fact, the interhemispheric fissure is traced from the location of the superior sagittal sinus selected as a trace starting point, and an approximate straight line of the trace line is denoted as the median line.

(3) The median line is located on the plane dividing the human body into its right and left halves. Therefore, in the step (2) for determining the median line of the head of the human body, the trace starting point is set at the center of gravity of the head region.

In the present invention, the object to be inspected is not limited to the human body.

DESCRIPTION OF THE PREFERRED EMBODIMENTS

Figure 2:
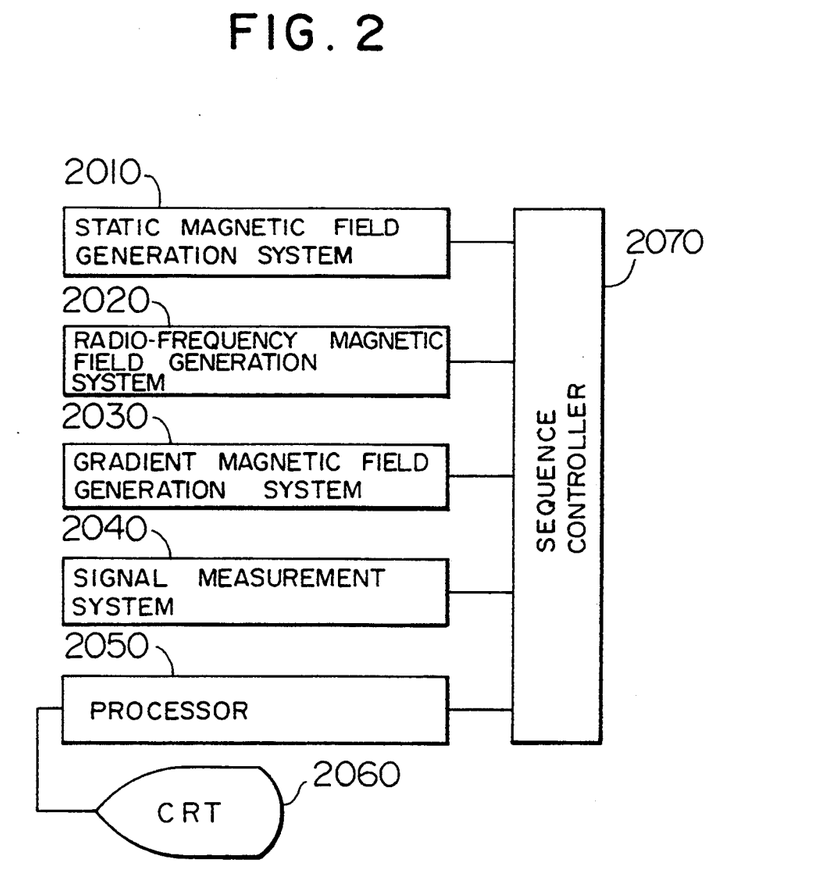
FIG. 2 is a block diagram showing the structure of an MRI apparatus to which the present invention is applied.

FIG. 2 is a block diagram showing the structure of an MRI apparatus to which the present invention is applied. Referring to FIG. 2, the MRI apparatus includes a static magnetic field generation system 2010 for generating a homogeneous static magnetic field, a radio-frequency magnetic field generation system 2020 for radiating a radio-frequency magnetic field, and a gradient magnetic field generation system 2030 capable of changing the magnetic field strength in the directions of the X, Y and Z axes independently of one another. The magnetic field generation systems 2010, 2020 and 2030 are controlled to induce the phenomenon of nuclear magnetic resonance in a human body to be diagnosed, and a signal measurement system 2040 receives an electromagnetic field generated from the human body being diagnosed. A processor 2050 implements image reconstruction on the basis of the received data, and the result of image reconstruction is displayed on a CRT 2060. A sequence controller 2070 controls the magnetic field generation systems 2010, 2020, 2030, the signal measurement system 2040 and the processor 2050. The sequence controller 2070 includes therein a memory for storing a sequence program and sequence parameters. The processor 2050 carries out processing for determining a desired region of the human body according to the method of the present invention.

The MRI apparatus carries out positioning of the desired region according to the chain oblique method (a method in which, when a line is drawn on an image, a slice position is set in a direction aligning with that line and perpendicular with respect to the image plane.) FIGS. 3A–3D show an imaging procedure for taking a transverse image of the head of the human body by the MRI apparatus.

Figure 3A:
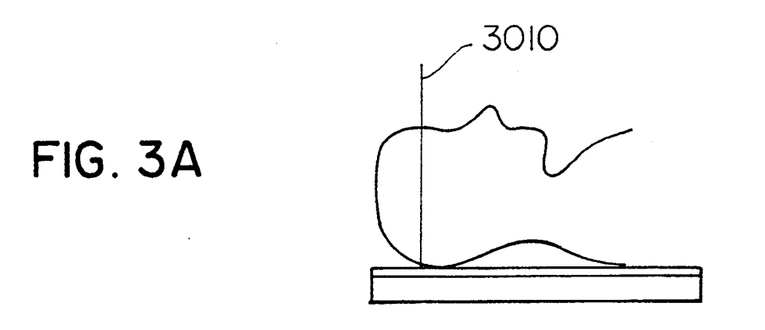
FIGS. 3A–3D illustrate one form of an imaging procedure for taking the transverse image of the head of the human body.
Figure 3B:
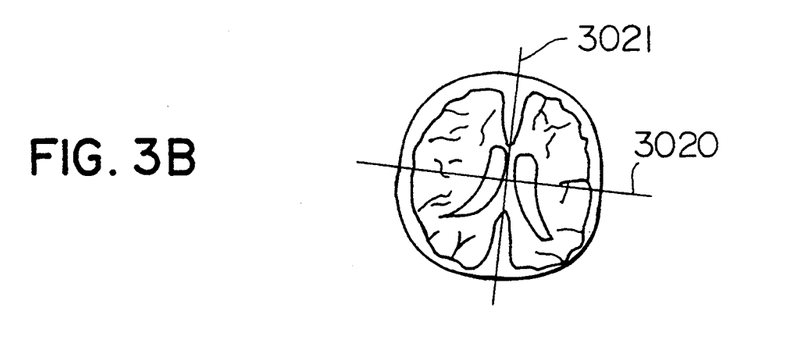
Figure 3C:
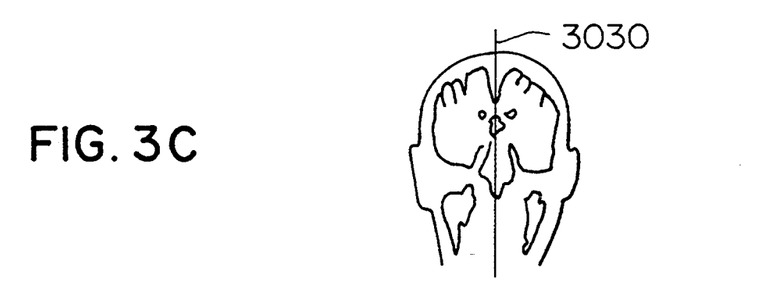
Figure 3D:
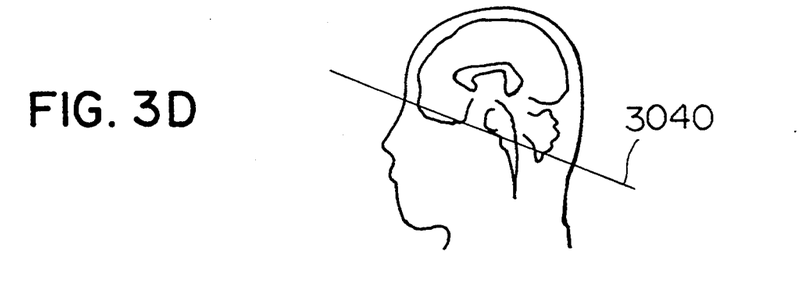

The patient is laid almost straight on a bed, but his axial section does not always accurately register with that of a desired tomographic image. When a highly accurate (distortion-free) tomographic image is required, imaging is desirably done according to the procedure shown in FIG. 3. A first slice direction 3010 is set to align with the direction of transverse imaging as shown in FIG. 3A, and a transverse image of the head of the patient is taken in that direction. Then, a second slice direction 3020 is set to be perpendicular with respect to the direction of the median line 3021 of the transverse image as shown in FIG. 3B, and a coronal image is taken. Then, a third slice direction 3030 is set to align with the median line of the coronal image as shown in FIG. 3C, and imaging is carried out. Finally, a fourth slice direction is set to align with the OM line 3040 as shown in FIG. 3D, and the desired tomographic image is taken.

In order to continuously implement the series of imaging described above, automatic positioning of the median line is indispensably required.

How to determine the median line by approximation by a plurality of procedures will now be described by taking the case of automatic positioning of the median line of the transverse image of the head as an example. These procedures are as follows:

(1) A procedure in which the location of the superior sagittal sinus lying behind the median line is determined by utilization of an artifact so as to determine the median line.

(2) A procedure in which the interhemispheric fissure is traced from the location of the superior sagittal sinus so as to determine the median line by approximation.

(3) A procedure in which the center of gravity of the tomographic image is based to trace the interhemispheric fissure so as to determine the median line by approximation.

The automatic positioning of the median line on the transverse image of the head is as described above. A coronal image of the head is also based to determine the median line according to the following procedure:

(4) A procedure in which the coronal image of the head is based to trace the interhemispheric fissure from the location of the center of gravity of the tomographic image so as to determine the median line by approximation.

These procedures will be described in more detail.

(1) Procedure in which an artifact is utilized so as to determine the location of the superior sagittal sinus:

Because of the blood flow through the superior sagittal sinus, an artifact appears when the image is taken by a sequence which does not restrict the blood flow. Because this artifact appears in the direction of phase encoding, artifacts intersecting each other can be produced by changing the direction of application of phase encoding. In the illustrated embodiment of the present invention, the point of intersection between these intersecting artifacts is determined as the locaton of the superior sagittal sinus.

Figure 4A:
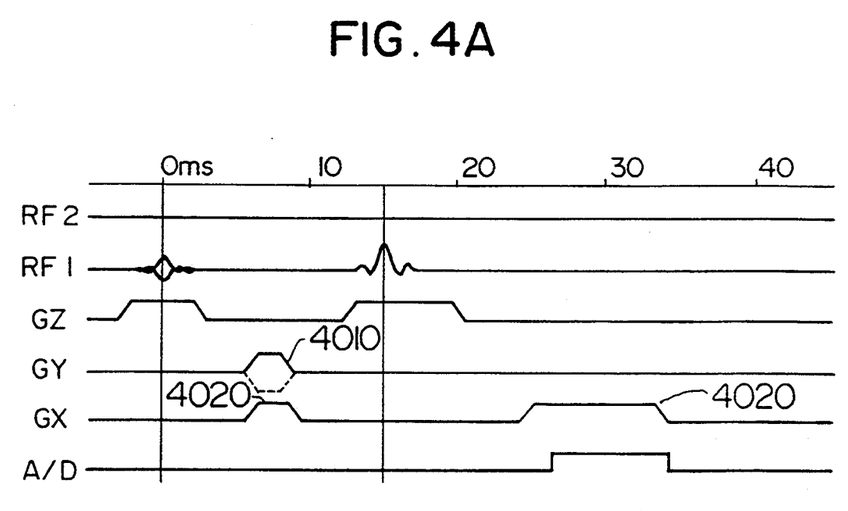
FIGS. 4A and 4B are timing charts of an imaging sequence to obtain blood flow artifacts intersecting each other.
Figure 4B:
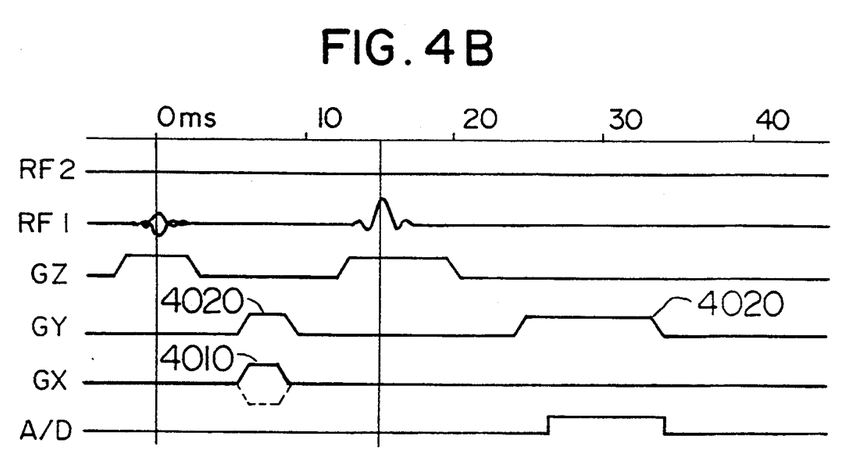

FIGS. 4A and 4B show examples of the imaging sequence. This sequence is that commonly called the spin echo method. FIGS. 4A and 4B differ from each other in that the direction of application of a gradient magnetic field 4010 for phase encoding purpose and the direction of application of a gradient magnetic field 4020 for signal reading purpose are exchanged. FIGS. 1A and 1B show the images taken according to these two sequences respectively. Artifacts 1010 and 1020 appear on these two images respectively. Because these two images are taken on the same region, one of the artifacts is subtracted from the other to obtain the absolute value as shown in FIG. 1C. In this case, an undesirable position deviation of the images may result due to, for example, distortions of the static and gradient magnetic fields. In such a case, the subtraction is preferably carried out after execution of various kinds of position deviation correction processing already known in the art. The values of pixels of the image shown in FIG. 1C are integrated in both the longitudinal and lateral directions, and the points where the integrated values are largest in both the axial directions are selected as the positions of the artifacts, so that the point of intersection 1030 can be determined. This point of intersection 1030 is determined as the location of the superior sagittal sinus.

Figure 5:
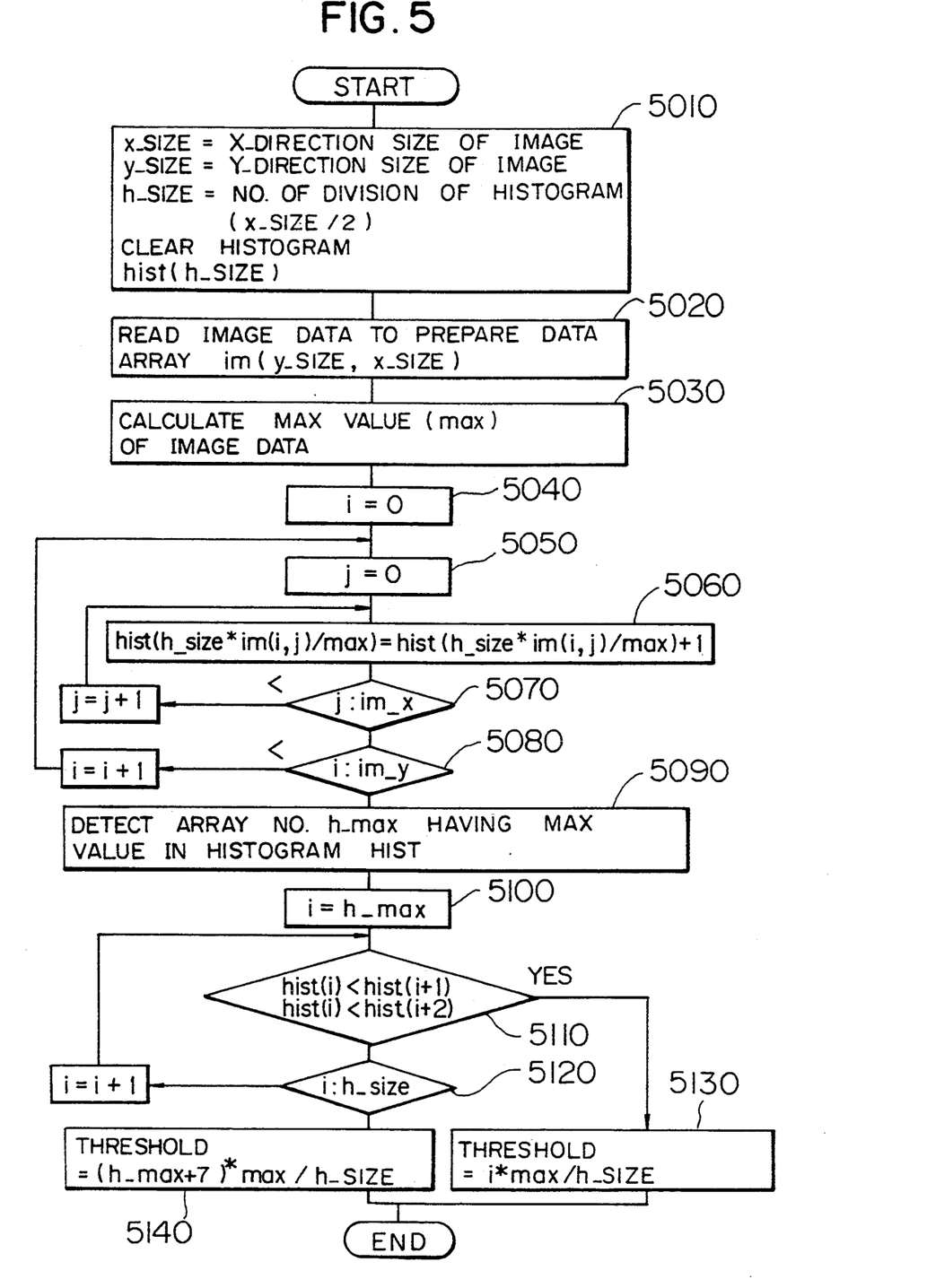
FIG. 5 is a flow chart of calculation of a threshold used for the purpose of edge detection.
Figure 6:
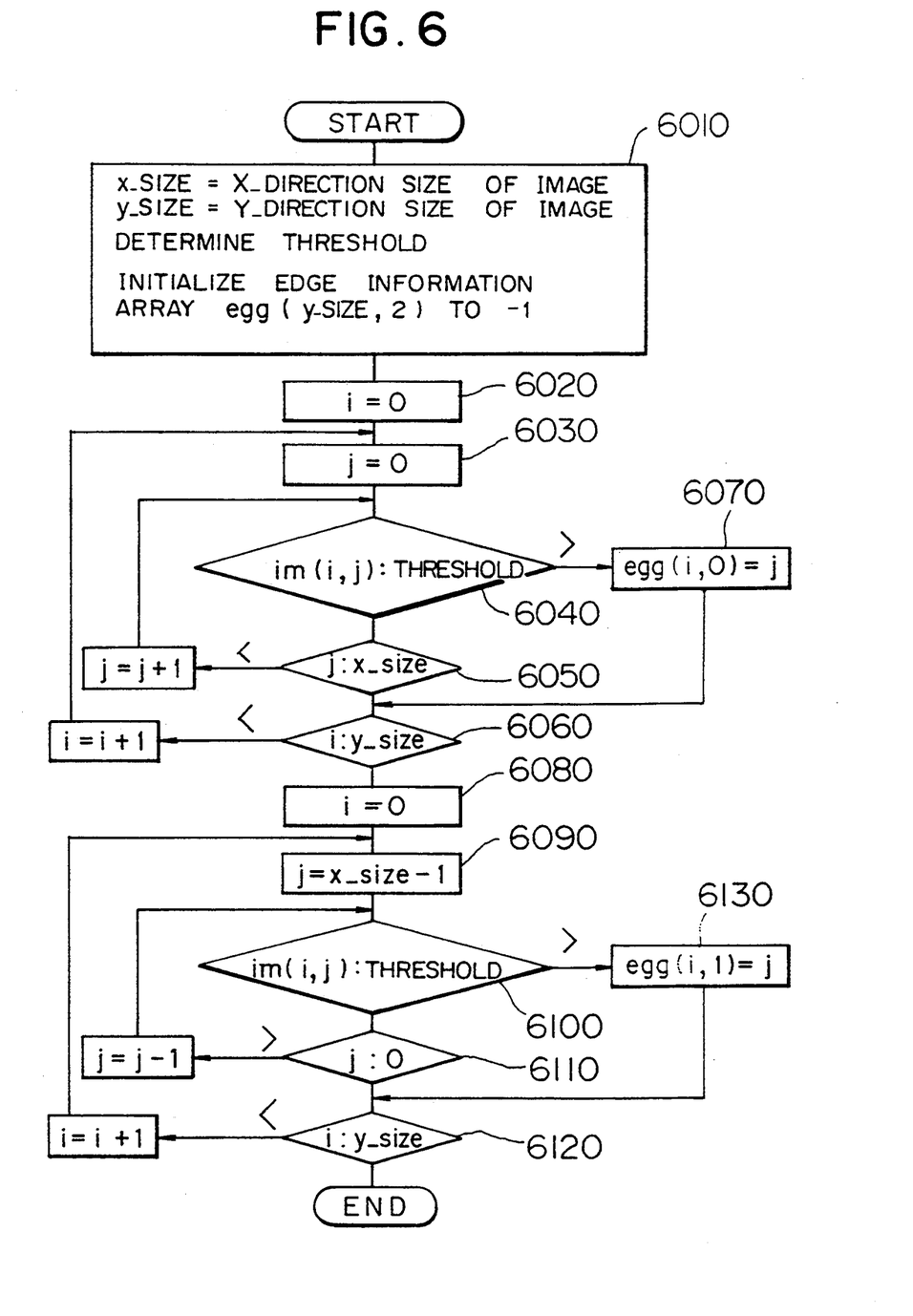
FIG. 6 is a flow chart of calculation of the edge line.
Figure 7:
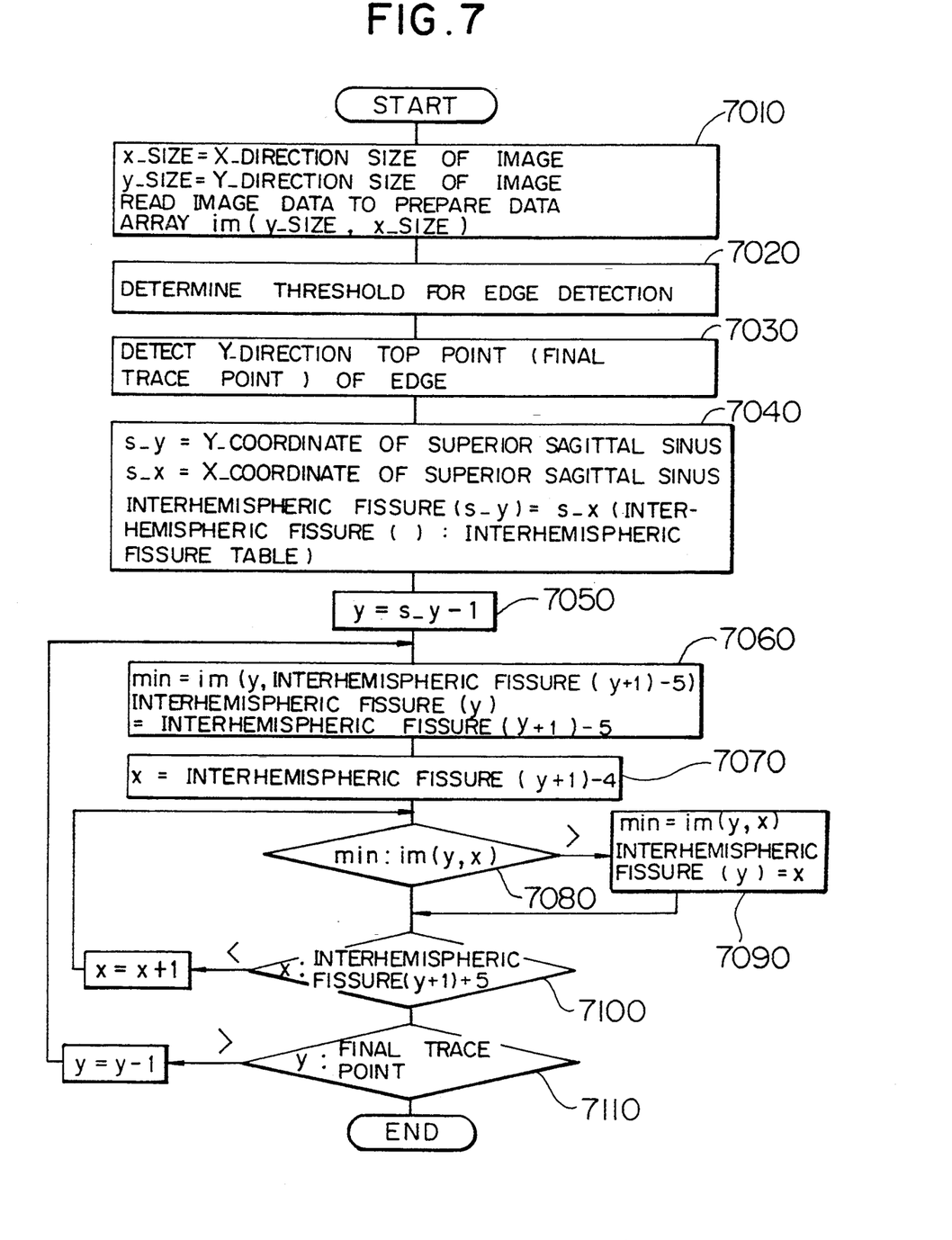
FIG. 7 is a flow chart of processing for tracing the interhemispheric fissure on the transverse image of the head.

(2) Procedure for determining the median line by tracing the interhemispheric fissure from the location of the superior sagittal sinus:

According to this procedure, the location of the superior sagittal sinus determined by the procedure (1) is based to trace the interhemispheric fissure, and a straight line obtained by approximating the trace line by the method of least squares is determined as the median line. FIGS. 5, 6 and 7 are flow charts of this procedure, and FIG. 8 shows the median line determined by the procedure.

(Process 1) Separation of the head region from the background region:

First, a threshold for separating the head of the patient from the background on the image is detected. Generally, the histogram of the image obtained by imaging by the MRI apparatus is in the form having two ridge portions. In the histogram, the ridge portion having a lower frequency distribution or density represents the background of the image, while the ridge portion having a higher density represents the region of the human body. Also, the maximum value of the ridge portion representing the background of the image provides the maximum value of the histogram. In this process, the value of the portion (the valley) intermediate between the two ridge portions in the histogram is used as the threshold.

FIG. 5 is a flow chart of a sequence of steps for calculating the threshold from the histogram. The process includes a step 5010 of setting various initial values, a step 5020 of reading image data, a step 5030 of calculating the maximum value of the image data, and steps 5040, 5050, 5060, 5070 and 5080 of preparing the histogram. The process further includes a step 5090 of cacutating the maximum value of the histogram prepared by the above steps, steps 5100, 5110 and 5120 of detecting the valley between two ridge portions of the histogram, and a step 5130 of calculating the threshold on the basis of the detected valley. When the valley does not exist in the histogram, the threshold is set in a step 5140.

Then, the edge line of the head relative to the background is determined. FIG. 6 is a flow chart of a sequence of steps for determining the edge line of the head on the basis of the threshold. The process includes a step 6010 of setting various initial values, steps 6020, 6030, 6040, 6050, 6060 and 6070 in which points having values larger than the threshold are searched in the direction of from the left end toward the right end of the image so as to determine the edge points, and steps 6080, 6090, 6100, 6110, 6120 and 6130 in which points having values larger than the threshold are searched in the direction of from the right end toward the left end of the image so as to determine the edge points. The zone inside these edge points is determined as the head region, while that outside the edge points is determined as the background region.

(Process 2) Trace of the interhemispheric fissure from the location of the superior sagittal sinus:

FIG. 7 is a flow chart of a sequence of steps for tracing the interhemispheric fissure from the location of the superior sagittal sinus. The process includes a step 7010 of reading the image and a step 7020 of determining the threshold together with the edge points according to the method described already. In a step 7030, the range for tracing the interhemispheric fissure is determined. In this range determination, the position where the edge point is first detected on the Y line extending downward from the top of the image is selected as a final trace point 8010 as shown in FIG. 8. The trace starts from the location of the superior sagittal sinus 8020 shown in FIG. 8. The tracing operation utilizes the fact that the interhemispheric fissure is blackened on the T1 weighted image. Thus, in steps 7040, 7050, 7060, 7070, 7080, 7090, 7100 and 7110, pixels having the minimum image density within the extent of the width of a plurality of pixels in the X direction are detected on a line connecting trace points. This manner of tracing is repeated until the interhemispheric fissure is traced up to the final trace point 8010 thereby deciding a trace line 8030 as shown in FIG. 8.

(Process 3) Determination of the median line on the basis of the trace line:

On the basis of the decided trace line, an approximate straight line 8040 as shown in FIG. 8 is calculated by approximation according to the method of least squares, and this line 8040 is denoted as the median line. The formula for calculating this straight line by approximation according to the method of least squares will now be described.

Calculation of the straight line by approximation according to the method of least squares:

Approximate straight line: $X = aY + b$ $a = (\int A(y)Ydy \int dy - \int A(y)dy \int Ydy)/(\int (Y\cdot Y)dy \int dy - \int Ydy \int Ydy)$ $b = (\int A(y)dy \int (Y\cdot Y)dy - \int (A(y)Y)dy \int Ydy)/(\int (Y\cdot Y)dy \int dy - \int Ydy \int Ydy)$ In the above equations, A(y): the X coordinate value corresponding to the Y coordinate value on the line tracing the interhemispheric fissure.

(3) Procedure for determining the median line by tracing the interhemispheric fissure on the basis of the location of the center of gravity of the tomographic image:

In this procedure, a point located near the center of gravity of the tomographic image is selected as the trace starting point.

First, the head region is separated from the background region on the image according to the procedure (2) described above. Then, the center of gravity of the head region is calculated according to the following formula:

Center of gravity:

$X = \int \int x^* f(x,y) dx dy / \int \int f(x,y) dx dy$ $Y = \int \int y^* f(x,y) dx dy / \int \int f(x,y) dx dy$ In the above equations:
x: the x coordinate value on the image,
y: the y coordinate value on the image, and
f(x, y): image data. The head region=1, and the background region=0.

The interhemispheric fissure exists near the center of gravity of the head region. Therefore, the point where the pixels having the minimum density are located in a rectangular range within the extent of the width of a plurality of pixels located at a position near the center of gravity of the head region is detected, and the trace is started from that point. The manner of tracing and the manner of calculating the straight line by approximation according to the method of least squares are similar to those described already in the procedure (2). In this case, however, the trace proceeds downward from the position of the center of gravity of the head region.

Figure 9:
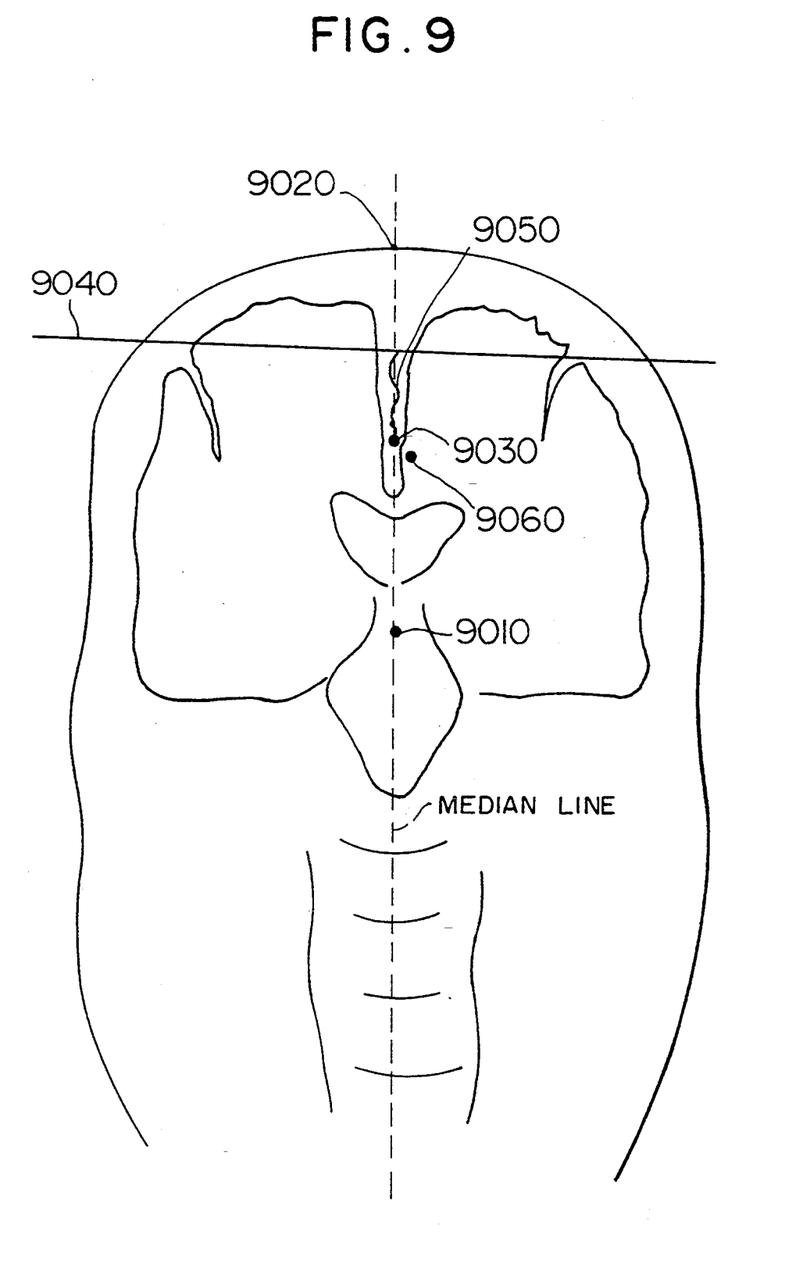
FIG. 9 illustrates how the median line is determined as a result of tracing the interhemispheric fissure on a coronal image of the head.

(4) Procedure for determining the median line on a coronal image of the head:

FIG. 9 shows a coronal image of the head. In the coronal image of the head, the interhemispheric fissure does not traverse the tomographic image and exists in the upper part of the tomographic image as shown.

In order to determine the median line, the head region is first separated from the background region in a manner similar to the procedure described already, and the edge line and the point of the center of gravity 9010 of the head are determined. Then, the top point 9020 of the edge line is determined. The determination of the top point of the edge line is such that the Y coordinate value first detected during a downward trace from the top of the image is selected as the edge top point 9020. A point 9060 for determining a trace starting point 9030 has a Y coordinate value between the center of gravity 9010 and the edge top point 9020, and the X coordinate is the coordinate of the center of gravity. The pixels having the minimum density are detected from a rectangular range near the point 9060 so determined so as to determine the trace starting point 9030. The interhemispheric fissure is traced from the trace starting point 9030 on the basis of the detected image density accordng to a procedure similar to that described already. A trace termination line 9040 is selected to be located beneath the edge top point 9020 but above the trace starting point 9030. This is because the blood vessel runs in the vicinity of the edge top point 9020, and the blood flowing through this blood vessel may have such a high concentration which will obstruct the otherwise successful tracing depending on the method of imaging. The trace termination line 9040 is selected to be located at such a position which avoids an undesirable trouble. A trace line 9050 is finally obtained as a result of tracing from the trace starting point 9030 to the trace termination line 9040, and a straight line obtained by approximating the trace line 9050 according to the method of least squares is selected as the median line.

It will be understood from the foregoing description of the present invention that the median line and the median plane can be automatically detected, so that, in the case of imaging to take a desired tomographic image of a human body by means of positioning on the basis of the median line (plane), the positioning can be continuously attained.

Further, because of the fact that the median line (plane) that is the index for implementing the desired accurate positioning can be automatically detected, the accuracy of determination of the imaging position can be improved.

What is claimed is:

1. A method for extracting a median line of a patient lying in an observation space of a magnetic resonance imaging system from magnetic resonance images of a slice of the patient obtained in the magnetic resonance imaging system, the method comprising:

a first step of executing a first imaging process to derive a first magnetic resonance image of said slice from magnetic resonance signals generated from said slice and encoded by applying a phase encoding gradient magnetic field along a first direction to the patient, a blood vessel crossing said slice at the medium line;

a second step of executing a second imaging process to obtain a second magnetic resonance image of said slice from magnetic resonance signals generated from said slice and encoded by applying a phase encoding gradient magnetic field along a second direction to the patient;

a third step of extracting a first artifact in said first magnetic resonance image caused by flow of blood in the blood vessel and a second artifact in said second magnetic resonance image caused by the flow of blood, respectively;

a fourth step of detecting a location of the blood vessel on the basis of locations of the extracted first and second artifacts; and a fifth step of extracting the median line by tracing low intensity pixels in one of said first magnetic resonance image and said second magnetic resonance image of said slice, said tracing being started from the detected location of the blood vessel.

2. A method according to claim 1, wherein said fifth step further includes a step of selecting a straight line which approximates the traced line as the median line.

3. A method according to claim 1, wherein said fourth step includes a step of detecting a position of an intersection of the first artifact and the second artifact when the first artifact and the second artifact overlap each other.

4. A method according to claim 1, wherein said third step includes the step of deriving a subtraction image between said first magnetic resonance image and said second magnetic resonance image.

5. A method according to claim 1, wherein said first direction and said second direction are orthogonal to each other, said third step includes the step of deriving a subtraction image between said first magnetic resonance image and said second magnetic resonance image, and wherein said fourth step of detecting the location of the blood vessel includes steps of integrating pixel values of said subtraction image along first integration lines extending parallel to a longitudinal axis direction, integrating the pixel values of said subtraction image along second integration lines extending parallel to a lateral axis direction, detecting a peak position of said integrated values along the first integration lines and a peak position of said integrated values along the second integration lines.

6. A method for extracting a median line of a patient head positioned in an observation space of a magnetic resonance imaging system from magnetic resonance images of a transverse slice of the patient head obtained in the magnetic resonance imaging system, the method comprising:

a first step of executing a first imaging process to derive a first magnetic resonance image of said transverse slice from magnetic resonance signals generated from said transverse slice and encoded by applying a phase encoding gradient magnetic field along a first direction to the patient head, a second step of executing a second imaging process to derive a second magnetic resonance image of said transverse slice from magnetic resonance signals generated from said transverse slice and encoded by applying a phase encoding gradient magnetic field along a second direction to the patient head, a third step of extracting a first artifact in said first magnetic resonance image caused by blood flowing in a superior sagittal sinus of the patient and a second artifact in said second magnetic resonance image caused by the flow of blood, respectively;

a fourth step of detecting a location of the superior sagittal sinus on the basis of locations of the first and second extracted artifacts; and a fifth step of extracting the median line by tracing an interhemispheric fissure of the patient on one of said first magnetic resonance image and said second magnetic resonance image of said transverse slice, said tracing being started from the detected location of the superior sagittal sinus.

7. A method for extracting a median line of a patient head positioned in an observation space of a magnetic resonance imaging system, the method comprising the steps of:

executing an imaging process with the magnetic resonance imaging system to derive a magnetic resonance image of a slice of the patient head which is positioned in the observation space of the magnetic resonance imaging system, extracting a region of the patient head from the magnetic resonance image, deriving a position of the center of gravity of the extracted region in the magnetic resonance image by setting a weight of homogeneous weight to the extracted region and by setting a zero to an unextracted region, tracing an interhemispheric fissure of the patient on the magnetic resonance image by tracing low intensity pixels in the magnetic resonance image from the position of the center of gravity, and selecting a straight line which approximates the traced line as the median line of the patient head which is positioned in the observation space of the magnetic resonance imaging system.

* * * * *